United States Patent
Lin et al.

(10) Patent No.: US 7,268,357 B2
(45) Date of Patent: Sep. 11, 2007

(54) IMMERSION LITHOGRAPHY APPARATUS AND METHOD

(75) Inventors: Chin-Hsiang Lin, Hsin-Chu (TW); Jen-Chien Shih, Yongkang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 348 days.

(21) Appl. No.: 11/129,975

(22) Filed: May 16, 2005

(65) Prior Publication Data

US 2006/0256306 A1  Nov. 16, 2006

(51) Int. Cl.
*G03F 1/00* (2006.01)
*G09G 3/04* (2006.01)
*G03B 27/42* (2006.01)
*H01J 37/07* (2006.01)

(52) U.S. Cl. ............... 250/492.22; 250/492.23; 250/492.2; 250/492.1; 250/491.1; 359/738; 359/740; 385/8

(58) Field of Classification Search ........... 250/492.22, 250/492.23
See application file for complete search history.

(56) References Cited

U.S. PATENT DOCUMENTS

| | | | | |
|---|---|---|---|---|
| 7,041,989 B1 * | 5/2006 | Neerhof et al. | ........... | 250/492.2 |
| 7,075,093 B2 * | 7/2006 | Gorski et al. | ............. | 250/492.2 |
| 7,141,340 B2 * | 11/2006 | Bleeker | ......................... | 430/5 |
| 7,196,772 B2 * | 3/2007 | Bleeker | ....................... | 355/67 |
| 2004/0196253 A1 * | 10/2004 | Eichenlaub | ................. | 345/102 |
| 2005/0007671 A1 * | 1/2005 | Onvlee | ........................ | 359/626 |
| 2005/0048220 A1 * | 3/2005 | Mertens et al. | ............. | 427/553 |
| 2005/0078287 A1 * | 4/2005 | Sengers et al. | ............... | 355/30 |
| 2005/0118528 A1 * | 6/2005 | Bleeker | ................... | 430/270.1 |
| 2005/0253093 A1 * | 11/2005 | Gorski et al. | .......... | 250/492.22 |
| 2005/0264778 A1 * | 12/2005 | Lof et al. | ...................... | 355/53 |
| 2006/0092396 A1 * | 5/2006 | Lipson et al. | ................. | 355/67 |
| 2006/0164593 A1 * | 7/2006 | Peyghambarian et al. | .. | 349/200 |
| 2006/0256306 A1 * | 11/2006 | Lin et al. | ...................... | 355/53 |
| 2007/0115453 A1 * | 5/2007 | Coon et al. | .................... | 355/77 |

* cited by examiner

Primary Examiner—Robert Kim
Assistant Examiner—Bernard Souw
(74) Attorney, Agent, or Firm—Haynes and Boone, LLP

(57) ABSTRACT

Disclosed is an immersion lithography system comprising a liquid crystal media. The liquid crystal is positioned between an objective lens and a substrate stage. A liquid crystal controller having a first electrode and a second electrode is configured to control the liquid crystal during an exposure process.

28 Claims, 2 Drawing Sheets

IMMERSION LITHOGRAPHY APPARATUS AND METHOD

BACKGROUND

The present disclosure relates generally to a photolithography system and, more particularly, to a liquid immersion lithography system and process.

The semiconductor integrated circuit (IC) technology has experienced rapid progress including the continued minimization of feature size and maximization of packing density. The minimization of feature size relies on the improvement in photolithography and its ability to print smaller features. The minimum feature size in an optical lithography system may be determined in part by diffraction, which is related to the wavelength of light and the medium through which the light shines. Accordingly, one approach to reducing feature size and improving resolution is to use light with a shorter wavelength.

Another approach is to use a medium between the lens and the substrate other than air. Since the index of refraction of a medium (referred to as 'n') is larger than one, the wavelength in the medium is reduced by the factor of n. This may improve resolution. One such method of enhancing resolution using a non-air medium is referred to as immersion lithography. Commonly used immersion lithography adopts water as media.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
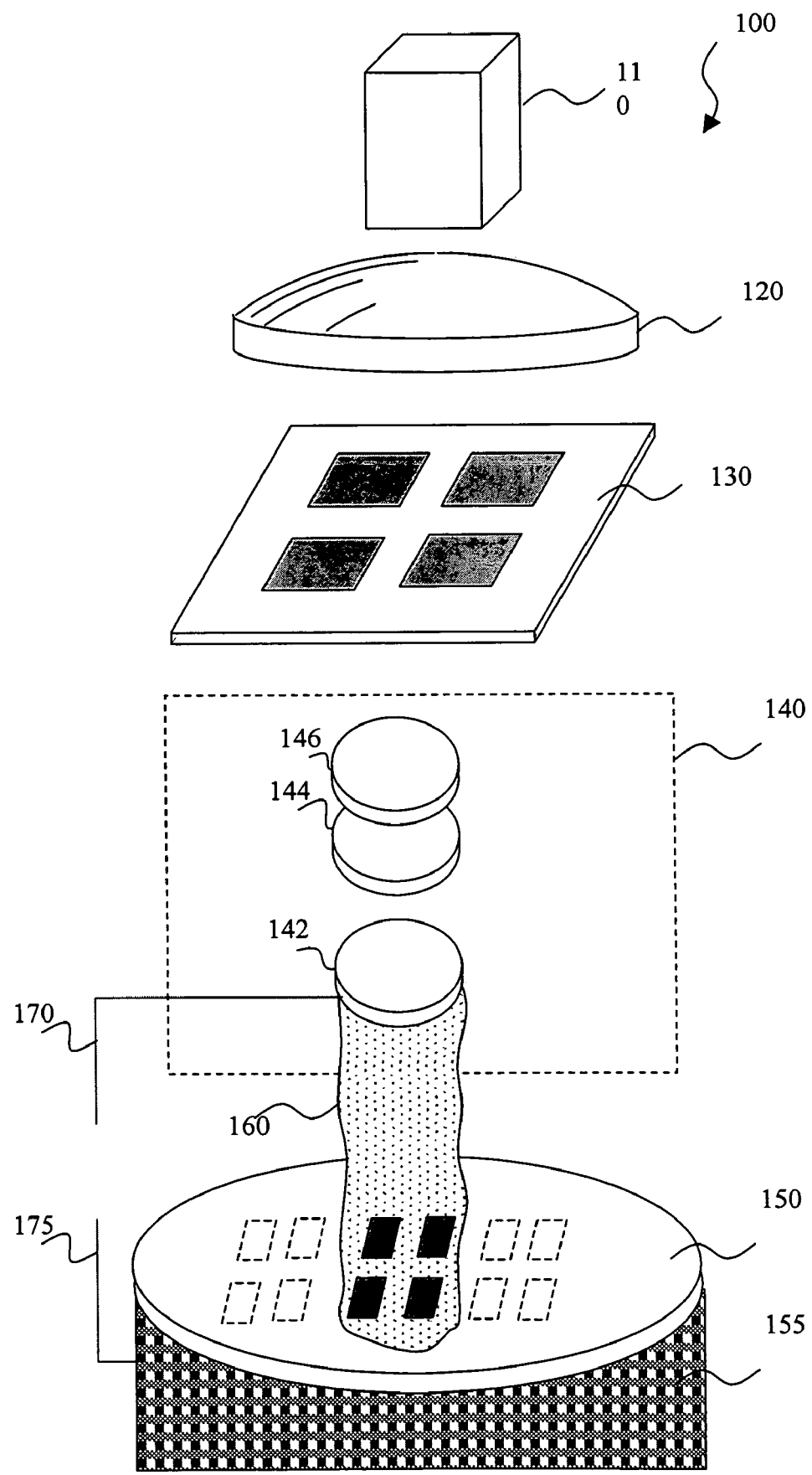
FIG. 1 is a schematic view of an exemplary embodiment of an immersion lithography system using liquid crystal.

The present disclosure relates generally to lenses for photolithography systems and, more particularly, to an objective lens for use in a liquid immersion lithography process. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, in one embodiment, a liquid crystal immersion lithography system 100 may include a radiation source 110. The radiation source 110 may be a suitable light source. For example, the source 110 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm).

It is understood that in the above description of light sources, each light source may have a certain wavelength distribution, or line width, rather than an exact single wavelength. For example, the I-line (e.g., 365 nm) wavelength of the mercury lamp may not be exactly 365 nm, but may be centered at approximately 365 nm with a range of varying wavelengths extending above and below 365 nm. This range may be used to determine a minimum possible line width during photolithography, with less variation from the desired 365 nm wavelength resulting in a thinner line width.

The liquid crystal immersion lithography system 100 may include an illumination system (e.g., the condenser) 120. The illumination system 120 may comprise a single lens or a lens system having multiple lenses and/or other lens components. For example, the illumination system 120 may include microlens arrays, shadow masks, and/or other structures designed to aid in directing light from the light source 110 onto the photomask 130.

During a photolithography patterning process, a photomask (also referred to as a mask or a reticle) 130 may be included in the liquid crystal immersion lithography system 100. The photomask 130 may comprise a transparent substrate and a patterned absorption layer. The transparent substrate may use fused silica ($SiO_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN. A light beam may be partially or completely blocked when hitting on an absorption region. The absorption layer may be patterned to have one or more openings through which a light beam may travel without being absorbed by the absorption layer.

The liquid crystal immersion lithography system 100 may include an objective lens 140. The objective lens 140 may comprise a single lens element or a plurality of lens elements such as ones illustrated as 142, 144, and 146 in FIG. 1. Each lens element may include a transparent substrate and may further include a plurality of coating layers. The transparent substrate may be a conventional objective lens, and may be made of fused silica ($SiO_2$), calcium-fluoride ($CaF_2$), lithium fluoride (LiF), barium fluoride ($BaF_2$), or other suitable material. The materials used for each lens element may be chosen based on the wavelength of light used in the lithography process to minimize absorption and scattering.

At least one lens element may have a coating layer being transparent to light beam illuminated from the light source 110. The coating layer may have a multilayer structure and may have various functions. The coating layer may function as one transparent electrode for applying voltage to tune a liquid crystal filled between the objective lens and a substrate. For example, the coating layer may comprise indium-tin-oxide (ITO) and/or other suitable materials. The coating layer may function as an anti-corrosion layer to protect the objective lens from being damage by the liquid crystal during an exposure process. The coating layer may be designed such that to function as a liquid crystal alignment layer. The coating layer may function as an anti-reflection coating (ARC) layer. The bottom objective lens element 142 may have a flat surface and may further optionally comprise a edge frame to constrain immersion liquid filled thereunder during a lithography process.

In the present example, a substrate 150 is placed in the liquid crystal immersion lithography system 100 for receiving a lithography process. The substrate 150 may be a semiconductor wafer comprising an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or any combination thereof. The substrate 150 may also have a photoresist coating layer during the lithography process. The substrate 150 may be positioned on a substrate stage 155 of the liquid crystal immersion lithography system 100 wherein the substrate stage 155 is capable of moving in translational and rotational modes such that the substrate 150 may be aligned with the photomask.

The liquid crystal immersion lithography system 100 uses a liquid crystal material 160 as an immersion media during a lithography process. Liquid crystal may be defined as a thermodynamic stable phase characterized by anisotropy of properties without the existence of a three-dimensional crystal lattice, and generally lying in the temperature range between the solid and isotropic liquid phase—hence the term mesophase. In the mesophase, associated parameters such as refractive index may be tunable by an external field including an electric field and a temperature field. Furthermore, the state of the liquid crystal may also depend on the boundary condition such as alignment structures on the boundary. In one example, liquid crystal may comprise anisotropic molecules which can change orientation on application of an applied voltage. The liquid crystal material may be formed using one or more material components. These material components may be selected for expected function and quality and may be tuned for optimized parameters including working temperature, optical absorption, refractive index n, $\Delta n$ (tunable range of n), compatibility to lens coating and photoresist, and other parameters.

A liquid crystal may exist in various structures including nematic and smectic. Nematic LC molecules all tend to align in the same direction to each other. They have a low viscosity and are highly anisotropic. Smectic LC molecules, of which there are various sub-groups, additionally align in layers. These materials have higher bulk viscosities, but certain configurations can switch much more quickly than nematics.

The liquid crystal immersion lithography system 100 may further include a pair of electrodes designed and configured such that a voltage can be applied thereon to form an electric field between the bottom of the objective lens and the substrate. A first electrode may comprise a conductive structure adjacent, proximate, or on the objective lens 140. For example, a transparent conductive film such as ITO film may be coated on the bottom surface of the lowest lens element 142 wherein the bottom surface has a direct contact with the liquid crystal filled between the objective lens and the substrate during a lithography process. Alternatively, an ITO film may be coated to the upper surface of the lens 142 wherein the upper surface has no direct contact with the liquid crystal during a lithography process. A second electrode may be designed adjacent, proximate, or on the substrate or the substrate stage. For example, the second electrode may be attached to the substrate stage in a proper configuration for an optimized electric field. In another example, the substrate may have a backside conductive coating or other intrinsic conductive features to utilized as the second electrode. Both the first and second electrodes may each further include a lead connected to a voltage source, respectively. Generally speaking, the voltage applied is an alternating one since a liquid crystal may experience a damage or a slow degradation under a constant electric field. Other configurations for electrodes are permissible as long as providing expected electric field and having no interference with light beams during the lithography process.

The liquid crystal 160 may be dispensed between the objective lens and the substrate extending to substantial bottom surface of the objective lens or substantial top surface of the substrate. In another embodiment, the liquid crystal media may only be extended to cover one exposure field area during a step-repeat or a step-scan exposing process. The liquid crystal may move along with the objective lens for a next exposing area or a scanning area. The liquid crystal may be constrained from the radial sides by a method including air pressure. The liquid crystal may be re-dispensed when a new substrate is positioned on the substrate stage. The objective lens may be cleaned after a plurality of substrates have been processed.

During a lithography process, a substrate is positioned on the substrate stage; the lithography system may be configured such that each of the two electrodes is well connected for applying voltage; a liquid crystal is then dispensed between the objective lens and the substrate in a proper way; a voltage is applied between the two electrodes to tune the liquid crystal for optimized lithography processing; and then illuminate a light beam through a photomask, objective lens, and the liquid crystal to the substrate. The exposing process may comprise multiple sub-exposing processes such as ones in a step-repeat technology or a continuous exposing process such as one in a step-scan technology. The exposing process is resumed until the targeted surface area of the substrate is exhausted. The substrate may then be unloaded from the lithography system and moved to a next fabrication step. The above processing flow may be repeated to other substrates in queue. Alternatively, the photomask may be changed before resuming for a next substrate if different pattern is expected such as when a different product is processed.

The liquid crystal immersion lithography provide a method and a system for an immersion lithograph process using a liquid crystal as an immersion media. The liquid crystal may have a high refractive index which can be designed through a method including composition selection and content adjustment. Furthermore, the liquid crystal can be dynamically tuned for optimized lithography processing including optimized refractive index and depth of focus (DOF) by applying a proper voltage or other suitable methods.

Figure 2:
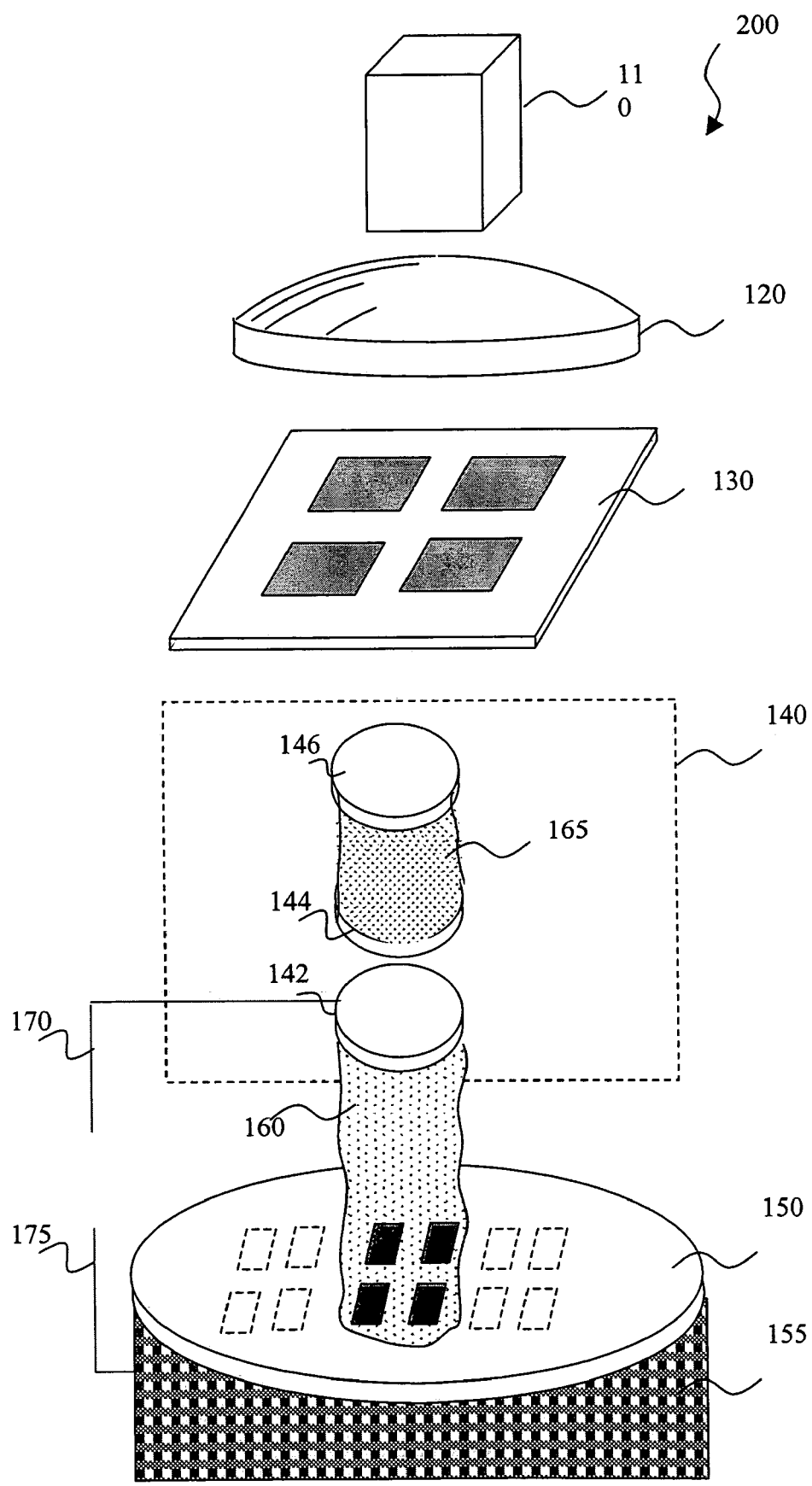
FIG. 2 is a schematic view of another embodiment of an immersion lithography system using liquid crystal.

Referring to FIG. 2, illustrated is a schematic view of one embodiment of a lithography system 200 using a liquid crystal, which is substantially similar to the immersion lithography system 100 except for that the system 200 is further designed for a second liquid crystal dispensed between two lenses and a second pair of electrodes (not shown) configured for applying a voltage tuning the second liquid crystal 165. In the lithography system 200, the liquid crystal 165 is dispensed between two objective lens elements and with or without a liquid crystal 160 being dispensed between the bottom objective lens element and the substrate. For example, the liquid crystal 165 may be dispensed between two lens elements 144 and 146 while the liquid crystal 160 is dispensed between a bottom objective lens element 142 and a substrate 150. The liquid crystal 165 is not necessarily the same material of the liquid crystal 160. The second pair of electrodes may be substantially similar to the electrode 175 in terms of material and configuration. The second liquid crystal 165 can be independently and dynamically tuned through applying a voltage onto the second pair of electrodes for processing optimization including DOF optimization. The liquid crystal 165 can be filled alone while the liquid crystal 160 does not exist (dry exposure system). The liquid crystal 165 (having a tunable refractive index) with associated components works mainly for focus control.

Thus, the present disclosure provides an immersion lithography system comprising an objective lens; a substrate stage positioned underlying the objective lens; and a liquid crystal controller having a first electrode and a second electrode configured to control a first liquid crystal at least partially filled a space between the objective lens and a substrate on the substrate stage during an exposure process.

In the immersion lithography system, the first electrode may be attached to the objective lens. The second electrode may be attached to the substrate stage. Alternatively, the second electrode may be attached to the substrate. The objective lens may comprise a coating layer transparent to a radiation beam for illumination during the exposure process. The coating layer may be electrically conductive. As an example, the coating layer may comprise indium-tin-oxide (ITO). The coating layer may be corrosion-proof during the exposure process. The coating layer may comprise a multiple-layer structure. The space between the objective lens and the substrate may range between about 1 mm and about 10 mm. The first liquid crystal can be tuned to optimize a lithography patterning during the exposure process. The first liquid crystal at least partially filled between the objective lens and the substrate during the exposure process may have a refractive index tunable using an electric field produced by applying a voltage between the first and second electrodes. The first liquid crystal at least partially filled between the objective lens and the substrate during the exposure process may be restrained from radial side by air pressure. The first liquid crystal at least partially filled between the objective lens and the substrate during the exposure process is extended at least to one exposing area. The substrate may comprise a semiconductor wafer coated with a photoresist layer. The objective lens may comprise $CaF_2$ and/or $SiO_2$. The immersion lithography system may further comprise a second liquid crystal controller having a third electrode and a fourth electrode configured to control a second liquid crystal filled between a first lens and a second lens during an exposure process. The second liquid crystal may have a second refractive index tunable by a second voltage applied between the third and fourth electrodes during the exposure process. The second refractive index may be tunable to optimize depth of focus.

The present disclosure also provides a lithography system. The lithography system comprises an objective lens having a first lens and a second lens, a substrate stage positioned underlying the objective lens, a liquid crystal filled between the first lens and the second lens, and a liquid crystal controller having an upper electrode and a lower electrode configured to control the liquid crystal. In the lithography system, a refractive index of the liquid crystal is tunable by a voltage applied between the upper and lower electrodes during the exposure process. The refractive index is tunable to optimize depth of focus.

The present disclosure provides a method by an immersion photolithography process. The method comprises positioning a substrate on a substrate stage of the immersion lithography system; setting up a lithography system such that a first electrode and a second electrode are configured to form an electric field between an objective lens and the substrate on the substrate stage when a voltage is applied between the first and second electrodes; dispensing a liquid crystal between the objective lens and the substrate; applying a voltage to the first and second electrodes for optimized patterning on the substrate; and illuminating the objective lens to perform a lithography exposing on the substrate.

The method may comprise setting up the first electrode next to the objective lens. The method may comprise setting up the second electrode onto the substrate stage. The method may comprise setting up the second electrode next to the substrate. In the method, dispensing a liquid crystal between an objective lens and the substrate may comprise selecting a proper liquid crystal. The method may further comprises constraining the liquid crystal from a radial side. The method may comprise utilizing a proper objective lens having a transparent coating functioning as the first electrode. The method may further comprise dispensing a second liquid crystal between a first lens and a second lens; and applying a second voltage to a third and fourth electrodes to optimize patterning on the substrate. The method of positioning a substrate on a substrate stage may comprise positioning a semiconductor wafer having a photoresist coating layer.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An immersion lithography system, comprising:
an objective lens;
a substrate stage positioned underlying the objective lens;
a liquid crystal at least partially filling a space between the objective lens and a substrate on the substrate stage; and
a liquid crystal controller having a first electrode and a second electrode configured to control the first liquid crystal.

2. The immersion lithography system of claim 1 wherein the first electrode is attached to the objective lens.

3. The immersion lithography system of claim 1 wherein the second electrode is attached to the substrate stage.

4. The immersion lithography system of claim 1 wherein the second electrode is attached to the substrate.

5. The immersion lithography system of claim 2 wherein the objective lens comprises a coating layer transparent to a radiation beam for illumination during the exposure process.

6. The immersion lithography system of claim 5 wherein the coating layer is electrically conductive.

7. The immersion lithography system of claim 6 wherein the coating layer comprises indium-tin-oxide (ITO).

8. The immersion lithography system of claim 5 wherein the coating layer is corrosion-proof during the exposure process.

9. The immersion lithography system of claim 5 wherein the coating layer comprises a multiple-layer structure.

10. The immersion lithography system of claim 1 wherein the space between the objective lens and the substrate ranges between about 1 mm and about 10 mm.

11. The immersion lithography system of claim 1 wherein the liquid crystal is tuned to optimize a lithography patterning during the exposure process.

12. The immersion lithography system of claim 1 wherein the liquid crystal has a refractive index tunable using an electric field produced by applying a voltage between the first and second electrodes.

13. The immersion lithography system of claim 12 wherein the liquid crystal is restrained from radial side-by-air pressure.

14. The immersion lithography system of claim 12 wherein the liquid crystal is extended to at least one exposing area of the substrate.

15. The immersion lithography system of claim 1 wherein the substrate is a semiconductor wafer coated with a photoresist layer.

16. The immersion lithography system of claim 1 wherein the objective lens comprises $CaF_2$.

17. The immersion lithography system of claim 1 wherein the objective lens comprises $SiO_2$.

18. A lithography system, comprising:
an objective lens having a first lens and a second lens;
a substrate stage positioned underlying the objective lens;
a liquid crystal filled between the first lens and the second lens; and
a liquid crystal controller having an upper electrode and a lower electrode configured to control the liquid crystal.

19. The lithography system of claim 18 wherein a refractive index of the liquid crystal is tunable by a voltage applied between the upper and lower electrodes during the exposure process.

20. The lithography system of claim 18 wherein the refractive index is tunable to optimize depth of focus.

21. An immersion photolithography process comprising:
positioning a substrate on a substrate stage of an immersion lithography system having an objective lens;
dispensing a liquid crystal between the objective lens and the substrate;
providing a first electrode and a second electrode configured to form an electric field between the objective lens and the substrate on the substrate stage when a voltage is applied;
applying a voltage to the first and second electrodes for altering a characteristic of the liquid crystal; and
illuminating the objective lens to perform a lithographic exposure on the substrate.

22. The method of claim 21 wherein the first electrode next is connected to the objective lens.

23. The method of claim 21 wherein the second electrode is connected to the substrate stage.

24. The method of claim 21 wherein the second electrode is connected to the substrate.

25. The method of claim 21 wherein dispensing a liquid crystal comprises selecting a proper liquid crystal for a predetermined refractive index.

26. The method of claim 21 wherein dispensing a liquid crystal comprises constraining the liquid crystal from a radial side.

27. The method of claim 21 further comprising:
dispensing a second liquid crystal between a first lens and a second lens; and
applying a second voltage to a third and fourth electrodes to optimize patterning on the substrate.

28. The method of claim 21 wherein positioning a substrate on a substrate stage comprises positioning a semiconductor wafer having a photoresist coating layer.

* * * * *